(12) United States Patent
Ido

(10) Patent No.: US 11,705,431 B2
(45) Date of Patent: Jul. 18, 2023

(54) SEMICONDUCTOR STORAGE DEVICE

(71) Applicant: Kioxia Corporation, Tokyo (JP)

(72) Inventor: Michio Ido, Kamakura (JP)

(73) Assignee: Kioxia Corporation, Tokyo (JP)

(*) Notice: Subject to any disclaimer, the term of this patent is extended or adjusted under 35 U.S.C. 154(b) by 122 days.

(21) Appl. No.: 17/204,461

(22) Filed: Mar. 17, 2021

(65) Prior Publication Data

US 2022/0084986 A1 Mar. 17, 2022

(30) Foreign Application Priority Data

Sep. 16, 2020 (JP) .................................. 2020-155713

(51) Int. Cl.
*H01L 25/065* (2023.01)
*H01L 23/538* (2006.01)
*G11C 5/06* (2006.01)

(52) U.S. Cl.
CPC ............ *H01L 25/0657* (2013.01); *G11C 5/06* (2013.01); *H01L 23/5386* (2013.01)

(58) Field of Classification Search
CPC ................... H01L 25/0657; H01L 23/5386
See application file for complete search history.

(56) References Cited

U.S. PATENT DOCUMENTS

| | | | |
|---|---|---|---|
| 2013/0148401 A1* | 6/2013 | Fai ................... | H01L 23/552 |
| | | | 257/E21.705 |
| 2013/0168871 A1 | 7/2013 | Kim et al. | |
| 2013/0344658 A1 | 12/2013 | Sakurada | |
| 2016/0181214 A1 | 6/2016 | Oh et al. | |
| 2016/0329303 A1* | 11/2016 | Ye ................... | H01L 23/49827 |
| 2017/0162546 A1* | 6/2017 | Fai ................... | H01L 21/56 |

FOREIGN PATENT DOCUMENTS

| | | |
|---|---|---|
| EP | 2 308 087 B1 | 8/2020 |
| JP | 2016-62962 A | 4/2016 |

* cited by examiner

*Primary Examiner* — Errol V Fernandes
(74) *Attorney, Agent, or Firm* — Oblon, McClelland, Maier & Neustadt, L.L.P.

(57) ABSTRACT

A semiconductor storage device according to an embodiment includes a substrate, a first semiconductor chip, and a second semiconductor chip. The first semiconductor chip includes a first surface contacting with the substrate, a second surface on an opposite side to the first surface, and a first pad provided on the second surface. The second semiconductor chip includes a third surface contacting with the second surface, a fourth surface on an opposite side to the third surface, and a cutout portion. The cutout portion is provided at a corner portion where the third surface crosses a lateral surface between the third surface and the fourth surface. The cutout portion overlaps with at least a part of the first pad as viewed from above the fourth surface.

10 Claims, 6 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2020-155713, filed on Sep. 16, 2020, the entire contents of which are incorporated herein by reference.

FIELD

The embodiments of the present invention relate to a semiconductor storage device.

BACKGROUND

In a semiconductor storage device such as a NAND-type EEPROM (Electrically Erasable Programmable Read-Only Memory), a plurality of memory chips is stacked on a substrate. Between the stacked memory chips and the substrate, bonding is performed using metal wires. Further, as for the semiconductor storage device, highly-integrated memory chips are demanded.

DETAILED DESCRIPTION

Figure 1:
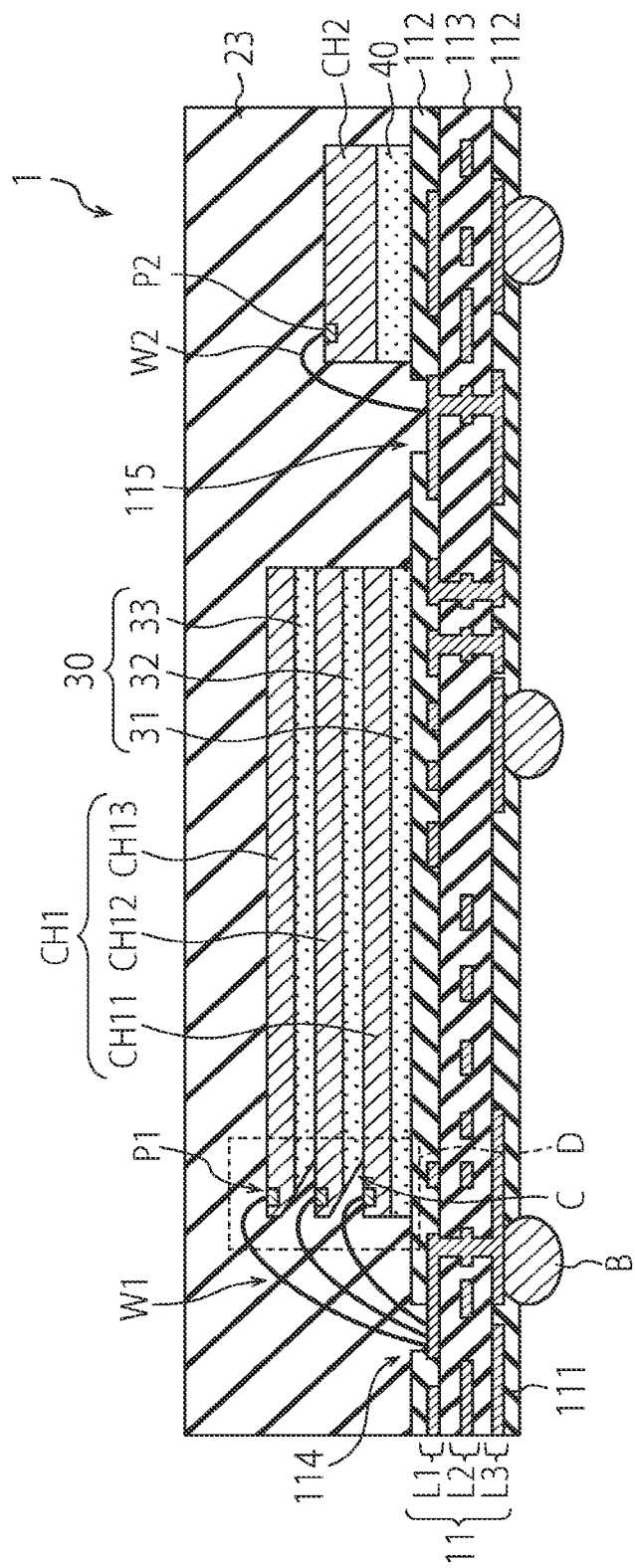
FIG. 1 is a cross sectional view of a semiconductor storage device according to a first embodiment and shows an exemplary configuration of the semiconductor storage device.

An embodiment according to the present invention will be described below with reference to the drawings. In the embodiment described below, a top-bottom direction of a substrate means a relative direction when a surface on which a semiconductor chip is provided is an upper side. The drawings are schematic or conceptual drawings. In the specification and the drawings, similar elements are denoted by identical reference characters.

A semiconductor storage device according to the embodiment includes a substrate, a first semiconductor chip, and a second semiconductor chip. The first semiconductor chip includes a first surface contacting with the substrate, a second surface on an opposite side to the first surface, and a first pad provided on the second surface. The second semiconductor chip includes a third surface contacting with the second surface, a fourth surface on an opposite side to the third surface, and a cutout portion. The cutout portion is provided at a corner portion where the third surface crosses a lateral surface between the third surface and the fourth surface. The cutout portion overlaps with at least a part of the first pad as viewed from above the fourth surface.

First Embodiment

FIG. 1 is a cross sectional view of a semiconductor storage device 1 according to the first embodiment and shows an exemplary configuration of the semiconductor storage device 1. The semiconductor storage device 1 includes a wiring substrate 11, an adhesion layer group 30, an adhesion layer 40, a semiconductor chip group CH1, a semiconductor chip CH2, a wire group W1, a wire W2, a resin 23, and metal bumps B.

The wiring substrate 11 is a substrate such as a printed circuit board, for example. The wiring substrate 11 may be a silicon substrate. The wiring substrate 11 can be connected with the semiconductor chip group CH1 and the semiconductor chip CH2 through the wire group W1 and the wire W2, respectively.

The adhesion layer group 30 includes a plurality of adhesion layers. Each of the adhesion layers included in the adhesion layer group 30 and the adhesion layer 40 is a film-shaped resin (DAF, Die Attach Film), for example. The adhesion layer group 30 and the adhesion layer 40 are provided above the wiring substrate 11. In the example shown in FIG. 1, the adhesion layer group 30 includes a plurality of adhesion layers 31, 32, 33.

In the semiconductor chip group CH1, a plurality of semiconductor chips is overlapped and bonded. That is, the semiconductor chip group CH1 has a stacked structure. The stacking number of the semiconductor chip group CH1 is set depending on the memory capacity. The semiconductor chip group CH1 is bonded to the wiring substrate 11 by the adhesion layer group 30.

The semiconductor chip CH2 is a controller chip, for example. The semiconductor chip CH2 is electrically connected with the semiconductor chip group CH1 and controls the operation of the semiconductor chip group CH1. For example, as shown in FIG. 1, the semiconductor chip CH2 is provided so as to be adjacent to the semiconductor chip group CH1 and is bonded to the wiring substrate 11 by the adhesion layer 40. For example, the semiconductor chip CH2 may be provided above the semiconductor chip group CH1. The semiconductor chip CH2 includes a pad P2 for connection with the wire W2.

The wire group W1 electrically connects the wiring substrate 11 and the semiconductor chip group CH1. The wire group W1 includes a plurality of wires. The material of the wires included in the wire group W1 is an electrically conductive metal such as gold, silver or copper, for example.

The wire W2 electrically connects the wiring substrate 11 and the semiconductor chip CH2. The material of the wire W2 is an electrically conductive metal such as gold, silver or copper, for example.

The resin 23 is an epoxy resin, for example. The resin 23 seals the semiconductor chip group CH1, the semiconductor chip CH2, the wire group W1 and the wire W2, on an upper surface of the wiring substrate 11. Thereby, the resin 23 protects the semiconductor chip group CH1, the semiconductor chip CH2, the wire group W1 and the wire W2 against external impact and external air.

The metal bump B is a solder ball, for example. The metal bump B electrically connects the semiconductor storage device 1 with an external mounting board (not illustrated) or the like. The material of the metal bump B is an electrically conductive metal such as solder. The metal bump B is provided on a lower surface of the wiring substrate 11. The metal bump B is connected with a wiring layer L3.

Next, the internal configuration of the wiring substrate 11 will be described. The wiring substrate 11 includes wiring 111 and resin layers 112, 113.

The wiring 111 electrically connects electrode pads (pads 114, 115) on the upper surface of the wiring substrate 11 and the metal bump B on the lower surface of the wiring substrate 11. The material of the wiring 111 is an electrically conductive metal such as copper or tungsten, for example. The wiring 111 includes a plurality of stacked wiring layers L1, L2, L3. The plurality of wiring layers L1, L2, L3 is insulated from each other by the resin layer 113. Further, the plurality of wiring layers L1, L2, L3 may be electrically connected with each other at a part by a via hole, for example. The pads 114, 115 are parts of the wiring layer L1, for example.

The resin layer 112 is an insulation material such as a solder resist, for example. The resin layer 113 is a prepreg, for example. The resin layer 113 is a composite material of a fibrous reinforcement material such as a glass cloth and a thermosetting resin such as epoxy, for example. The resin layer 113 has a higher strength and rigidity than the resin layer 112.

Next, the internal configuration of the semiconductor chip group CH1 will be described. For example, as shown in FIG. 1, the semiconductor chip group CH1 includes a plurality of semiconductor chips CH11, CH12, CH13.

Each of the plurality of semiconductor chips CH11, CH12, CH13 is a memory chip, for example. Each of the plurality of semiconductor chips CH11, CH12, CH13 is a NAND chip, for example. The plurality of semiconductor chips CH11, CH12, CH13 has the same structure, for example. The semiconductor chip CH11 is bonded to the wiring substrate 11 through the adhesion layer 31. The semiconductor chip CH12 is bonded to the semiconductor chip CH11 through the adhesion layer 32. The semiconductor chip CH13 is bonded to the semiconductor chip CH12 through the adhesion layer 33. Each of the plurality of semiconductor chips CH11, CH12, CH13 includes a semiconductor element, for example. The semiconductor element is a memory cell array or a CMOS circuit (Complementary Metal-Oxide-Semiconductor circuit), for example.

Figure 2:
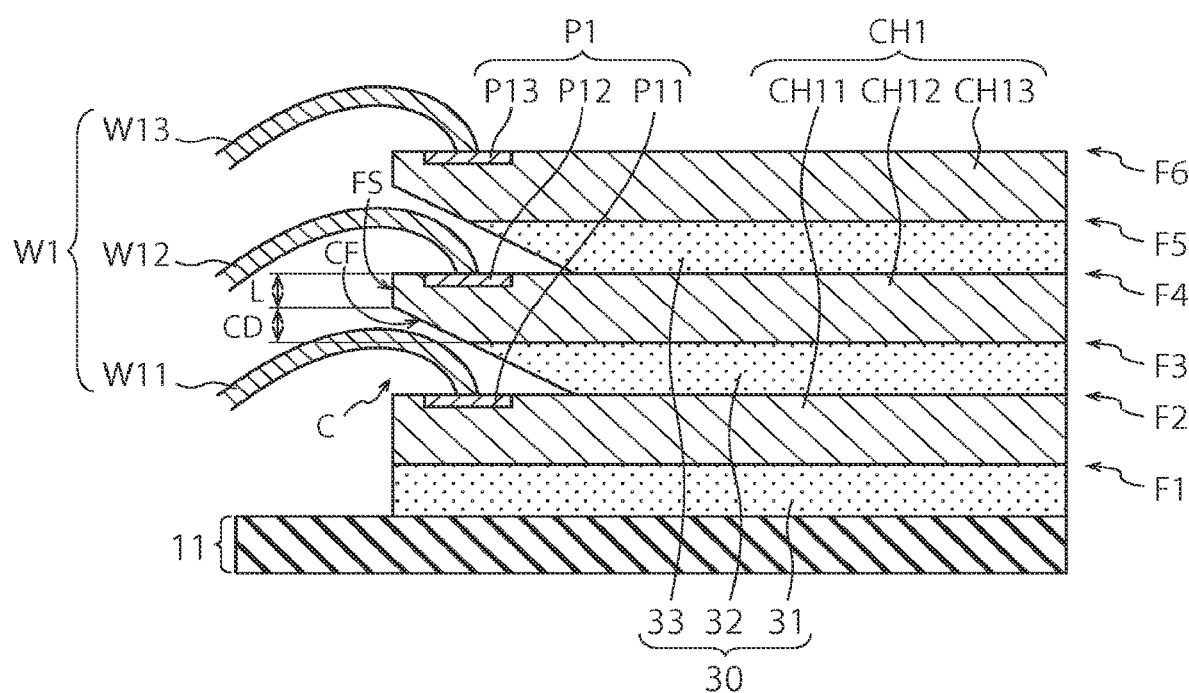
FIG. 2 is an enlarged cross sectional view of the semiconductor storage device according to the first embodiment and shows an exemplary configuration of the semiconductor storage device.

FIG. 2 is an enlarged cross sectional view of the semiconductor storage device 1 according to the first embodiment and shows an exemplary configuration of the semiconductor storage device 1. FIG. 2 is an enlarged view of a dotted frame D in FIG. 1. In FIG. 2, the resin 23 is not illustrated.

The semiconductor chip CH11 includes a surface F1, a surface F2, and a pad P11. The surface F1 is a surface facing the wiring substrate 11. The surface F2 is a surface on the opposite side to the surface F1. The pad P11 is a part of wiring of the semiconductor chip CH11. The pad P11 is provided on the surface F2. At the surface F1, the semiconductor chip CH11 is bonded to the wiring substrate 11 through the adhesion layer 31. The semiconductor chip CH11 is the lowest chip.

The semiconductor chip CH12 includes a surface F3, a surface F4, a pad P12, and a semiconductor substrate. The surface F3 is a surface facing the wiring substrate 11. The surface F4 is a surface on the opposite side to the surface F3. The pad P12 is a part of wiring of the semiconductor chip CH12. The pad P12 is provided on the surface F4. In the example shown in FIG. 2, the pad P12 is disposed such that a part of the pad P12 overlaps with the pad P11 as viewed from above the surface F4. The semiconductor substrate is a silicon substrate, for example. On the semiconductor substrate, a semiconductor element is provided. The semiconductor substrate is disposed on the surface F3 of the semiconductor chip CH12. At the surface F3, the semiconductor chip CH12 is bonded to the surface F2 of the semiconductor chip CH11 through the adhesion layer 32. The semiconductor chip CH12 is bonded to the semiconductor chip CH11, so as to overlap with at least a part of the pad P11 as viewed from above. The semiconductor chip CH12 is disposed such that a center position of the semiconductor chip CH12 roughly coincides with a center position of the semiconductor chip CH11 as viewed from above. The semiconductor chip CH12 is disposed directly above the semiconductor chip CH11.

The semiconductor chip CH13 includes a surface F5, a surface F6, and a pad P13. The surface F5 is a surface facing the wiring substrate 11. The surface F6 is a surface on the opposite side to the surface F5. The pad P13 is a part of wiring of the semiconductor chip CH13. The pad P13 is provided on the surface F6. At the surface F5, the semiconductor chip CH13 is bonded to the surface F4 of the semiconductor chip CH12 through the adhesion layer 33. The semiconductor chip CH13 is bonded to the semiconductor chip CH12, so as to overlap with at least a part of the pad P12 as viewed from above. The semiconductor chip CH13 is disposed such that a center position of the semiconductor chip CH13 roughly coincides with a center position of the semiconductor chip CH12 as viewed from above. The semiconductor chip CH13 is disposed directly above the semiconductor chip CH12.

In this way, the semiconductor chip CH13 having the same configuration as the semiconductor chip CH12 is stacked above the semiconductor chip CH12. In the case where four or more semiconductor chips are stacked, a semiconductor chip having the same configuration as the semiconductor chip CH12 may be repeatedly stacked above the semiconductor chip CH13.

Next, the internal configuration of the wire group W1 will be described. As shown in FIG. 2, the wire group W1 includes wires W11, W12, W13. The wire W11 is electrically connected with the pad P11 provided on the semiconductor chip CH11 and the pad 114 provided on the wiring substrate 11. Similarly, the wire W12 is electrically connected with the pad P12 provided on the semiconductor chip CH12 and the pad 114. The wire W13 is electrically connected with the pad P13 provided on the semiconductor chip CH13 and the pad 114.

For example, the wire W11 is provided so as to stand upward from the pad P11. Further, the wire W11 extends downward such that a peak is formed. The wire W11 extending downward is connected with the pad 114 of the wiring substrate shown in FIG. 1. In this way, the pad P11 of the semiconductor chip CH11 is electrically connected with the wire W11 extending from the wiring substrate 11.

Next, a cutout portion C will be described.

The semiconductor chip CH12 includes a cutout portion C at an outer periphery portion of the surface F3. The outer periphery portion of the surface F3 is a corner portion where the surface F3 crosses a lateral surface FS between the surface F3 and the surface F4. The cutout portion C is also a concave portion that is provided at a lower portion of the lateral surface FS of the semiconductor chip CH12. The cutout portion C is provided so as to face the pad P11.

More specifically, the cutout portion C is provided such that the wire W11 and a cutout surface CF of the semiconductor chip CH12 are away from each other. The cutout surface CF is a surface of the semiconductor chip CH12 that is exposed by the formation of the cutout portion C. The cutout surface CF is positioned lateral to a portion of the wire W11 where the wire W11 is bent such that the peak is formed. The cutout portion C makes it possible to avoid the contact between the wire W11 and the semiconductor chip CH12. Thereby, it is possible to restrain the damage of the wire W11 and the semiconductor chip CH12 due to the contact. As a result, it is possible to restrain the decrease in the reliability of the semiconductor storage device 1.

More specifically, the cutout portion C is provided such that a cutout depth CD gradually increases from a center portion of the surface F3 to an outer periphery side. The cutout depth CD is the depth of the cutout portion C with respect to the surface F3. In the example shown in FIG. 2, the cutout portion C is provided such that the inclination angle of the cutout surface CF with respect to the surface F3 is roughly constant. That is, the cutout surface CF is a flat surface that has a roughly constant inclination angle.

The cutout portion C is provided on the semiconductor substrate of the semiconductor chip CH12. The cutout portion C is provided below a region in the semiconductor chip CH12 where the semiconductor element is provided. It is preferable that a length L indicating the thickness of the thinnest portion of the semiconductor chip CH12 be equal to or more than the thickness of the semiconductor element. As necessary, a margin may be added to the length L. This is because it is possible to restrain the damage of the semiconductor element that can occur by the formation of the cutout portion C. As a result, it is possible to improve the reliability of the operation of the semiconductor chip CH12. The thickness of the semiconductor element is about 10 μm, for example.

It is preferable that a pad be provided roughly directly above a cutout portion in a certain semiconductor chip. In the example shown in FIG. 2, the pad P12 is disposed such that a part of the pad P12 overlaps with the cutout portion C as viewed from above the surface F4. For example, a protection element and the like are provided at the periphery of the pad P12.

For example, the cutout portion is provided also on the semiconductor chip CH13. The disposition, shape and others of the cutout portion of the semiconductor chip CH13 are the same as those of the cutout portion C of the semiconductor chip CH12, for example.

For example, the cutout portion is not provided on the semiconductor chip CH11, which is the lowest chip. Thereby, it is possible to restrain the decrease in the reliability of the operation of the semiconductor chip CH11, from a standpoint of the damage of the semiconductor element.

For example, the cutout portion may be provided on all semiconductor chips included in the semiconductor chip group CH1. Accordingly, it is possible to apply an identical production process to all semiconductor chips. As a result, it is possible to improve the production efficiency of the semiconductor storage device 1.

It is preferable that the cutout portion C be provided such that a space having a height of about 25 μm is obtained at the periphery of the pad P11. The diameter of the wire W11 is about 15 μm, for example. The height from the pad P11 to the peak of the wire W11, that is, the height of the loop is about 10 μm, for example. Therefore, the sum of the diameter of the wire W11 and the height of the loop is about 25 μm. It is preferable that the cutout portion C be provided such that the cutout depth CD is about 15 μm. The thickness of the adhesion layer 32 is about 10 μm, for example. The height resulting from subtracting the thickness of the adhesion layer 32 from the height of the above space is about 15 μm. The above numerical values are examples, and may be altered depending on the sizes, shapes and others of the semiconductor chip CH12, the adhesion layer 32, the pad P11 and the wire W11.

Figure 3:
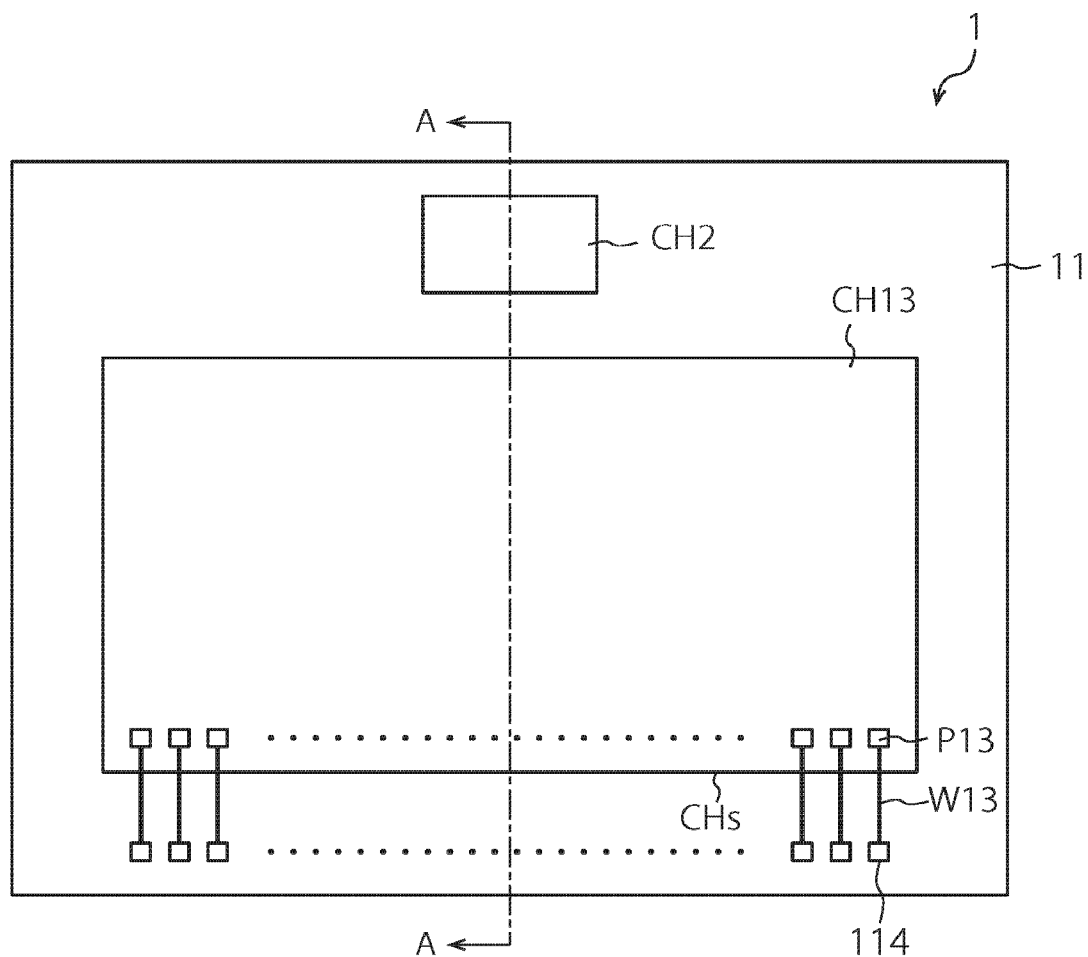
FIG. 3 is a plan view of the semiconductor storage device according to the first embodiment and shows an exemplary constituent disposition of the semiconductor storage device.

Next, the disposition of the semiconductor chip CH13 and the pad P13 on the wiring substrate 11 will be described. FIG. 3 is a plan view of the semiconductor storage device 1 according to the first embodiment and shows an exemplary constituent disposition of the semiconductor storage device 1. FIG. 3 is a diagram of the semiconductor chip group CH1 as viewed from above. A line A-A in FIG. 3 shows a cross section corresponding to FIG. 1, which is a cross sectional view. The semiconductor chips CH11, CH12, CH13 are provided so as to overlap with each other.

As shown in FIG. 3, a plurality of pads P13 is provided along a side CHs of the semiconductor chip CH13. The side CHs is one of the sides of the semiconductor chip CH13. The pad P13 is electrically connected with the pad 114 on the wiring substrate 11 through the wire W13, which connects with the pad P13 from below the paper plane of FIG. 3.

Next, a production method for the semiconductor storage device 1 will be described.

Figure 4:
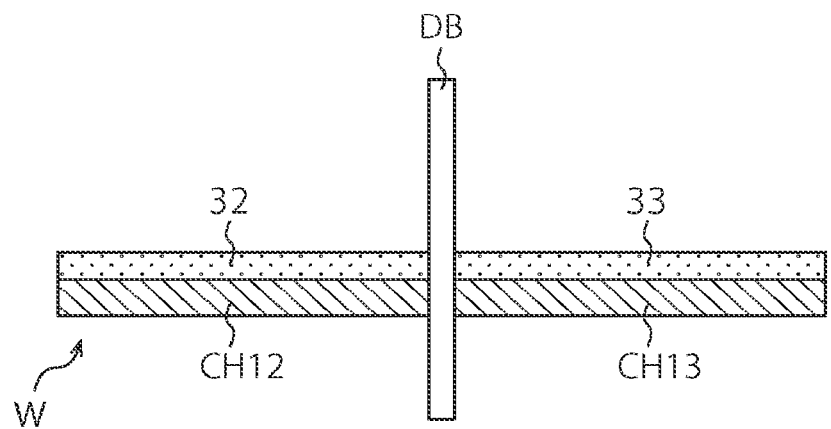
FIG. 4 is a cross sectional view that shows an exemplary separation method for a semiconductor wafer according to the first embodiment.
Figure 5:
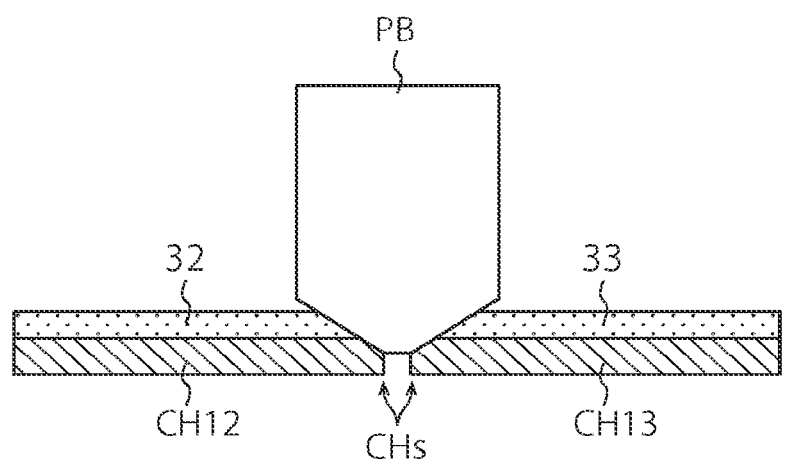
FIG. 5 is a cross sectional view that shows an exemplary processing method for a semiconductor chip according to the first embodiment.

FIG. 4 is a cross sectional view that shows an exemplary separation method for a semiconductor wafer W according to the first embodiment. FIG. 5 is a cross sectional view that shows an exemplary processing method for the semiconductor chips CH12, CH13 according to the first embodiment.

First, the semiconductor wafer W is cut by a dicing blade DB. Thereby, the semiconductor wafer W is separated into the semiconductor chip CH12 and the semiconductor chip CH13, for example.

Next, the side CHs of the semiconductor chips CH11, CH12 is processed by a processing blade PB. For example, the processing blade PB is thicker than the dicing blade DB and has a tapered tip. Thereby, it is possible to process the outer periphery portion of the contact surface of the semiconductor chip CH12 with the adhesion layer 32, into a tapered shape. Similarly, it is possible to process the outer periphery portion of the contact surface of the semiconductor chip CH13 with the adhesion layer 33, into a tapered shape. Thereafter, the semiconductor chips CH12, CH13 are mounted on the semiconductor chip CH11. For example, placing of the separated semiconductor chip CH12, bonding of the wire W12, placing of the semiconductor chip CH13 and boding of the wire W13 are performed in this order. In this way, the semiconductor chip group CH1 is stacked.

The processing by the processing blade PB may be performed before the separation into the semiconductor chips CH12, CH13 by the dicing blade DB. For improving the processability of the adhesion layers 32, 33, which are soft, a dummy wafer or the like that functions as a cover plate for processing, for example, may be provided on the adhesion layer 32, 33 in FIG. 5, before the processing. The processing method is not limited to the above example. For example, it is allowable to use a blade having a shape that makes it possible to concurrently perform the separation and processing of the semiconductor chips CH12, CH13. Further, it is allowable to perform the processing of the semiconductor chips CH12, CH13 by laser.

As described above, according to the first embodiment, it is possible to stack the plurality of semiconductor chips CH11, CH12, CH13 without displacing them. As a result, it is possible to improve the flexibility of the disposition of each constituent in the semiconductor storage device 1. Further, the plurality of semiconductor chips can be more highly integrated in a direction perpendicular to the stacking direction.

On the semiconductor chip CH12, the cutout portion C is provided. By the cutout portion C, it is possible to expand an interspace between the semiconductor chip CH11 and the semiconductor chip CH12. Thereby, it is possible to stack the semiconductor chip CH12 without displacing the semiconductor chip CH12 from the other semiconductor chip CH11.

In the first embodiment, an interposer, a spacer or the like is not provided among the semiconductor chips CH11, CH12, CH13. Only the adhesion layer 32 is provided between the semiconductor chips CH11, CH12, and only the adhesion layer 33 is provided between the semiconductor chips CH12, CH13. Thereby, the semiconductor chip group CH1 can be highly integrated in the stacking direction.

In the first embodiment, it is possible to dispose the semiconductor chips CH11, CH12, CH13 without displacing them. Accordingly, it is possible to connect the wire group W1 with the semiconductor chip group CH1, at one side of the semiconductor chip group CH1. Thereby, it is possible to restrain the variation in wiring length between the semiconductor chips CH11, CH12, CH13 and the semiconductor chip CH2. In addition, it is possible to further uniform the electric characteristics of the semiconductor chips CH11, CH12, CH13.

The wire group W1 does not always need to be connected with the semiconductor chip group CH1, at one side of the semiconductor chip group CH1. For example, a pad group P1 for an even level of the stack and a pad group P1 for an odd level of the stack may be disposed on mutually opposite sides. Further, the pad group P1 may be provided on two sides of one semiconductor chip. Even in these cases, the cutout portion is provided such that the wire group W1 does not contact with the semiconductor chip group CH1.

As another method for stacking a plurality of semiconductor chips without displacing them, there is known a method in which interposers, spacers or the like are provided among the plurality of semiconductor chips so as not to overlap with pads. However, in this case, the high integration is difficult because of the thickness of the interposers, the spacers or the like, which are provided depending on the stacking number.

Figure 6:
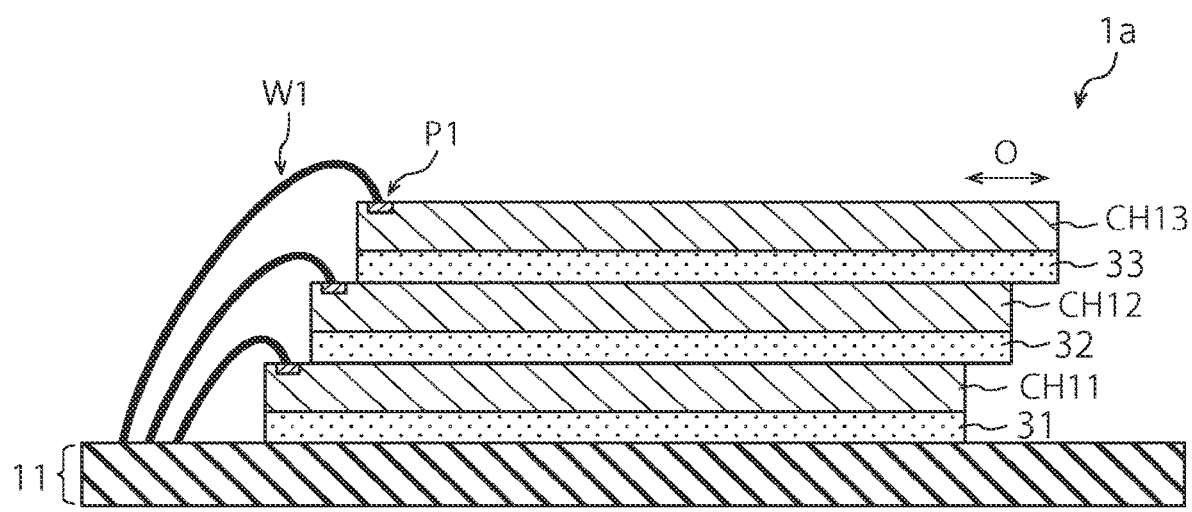
FIG. 6 is a cross sectional view of a semiconductor storage device according to a first comparative example and shows an exemplary configuration of the semiconductor storage device.

FIG. 6 is a cross sectional view of a semiconductor storage device 1a according to a first comparative example and shows an exemplary configuration of the semiconductor storage device 1a.

Generally, there is known a method in which the semiconductor chips CH11, CH12, CH13 are stacked so as to be displaced in a stepwise manner as shown in FIG. 6, in order to avoid the semiconductor chips CH11, CH12, CH13 from overlapping on the pad group P1 that is connected with the wire group W1. However, in this case, as the stacking number increases, a displacement amount O between the semiconductor chip CH11 as the lowest chip and the semiconductor chip CH13 as the highest chip becomes larger. A large displacement amount O requires a space that is wide in the direction perpendicular to the stacking direction. Accordingly, there is a possibility of the decrease in the flexibility of the disposition of each constituent in the semiconductor storage device 1a. For example, depending on some products or others, it may be necessary to dispose semiconductor chips in a smaller housing at a high density. In this case, there is a possibility that the product design is difficult because the space for the displacement amount O cannot be secured.

Figure 7:
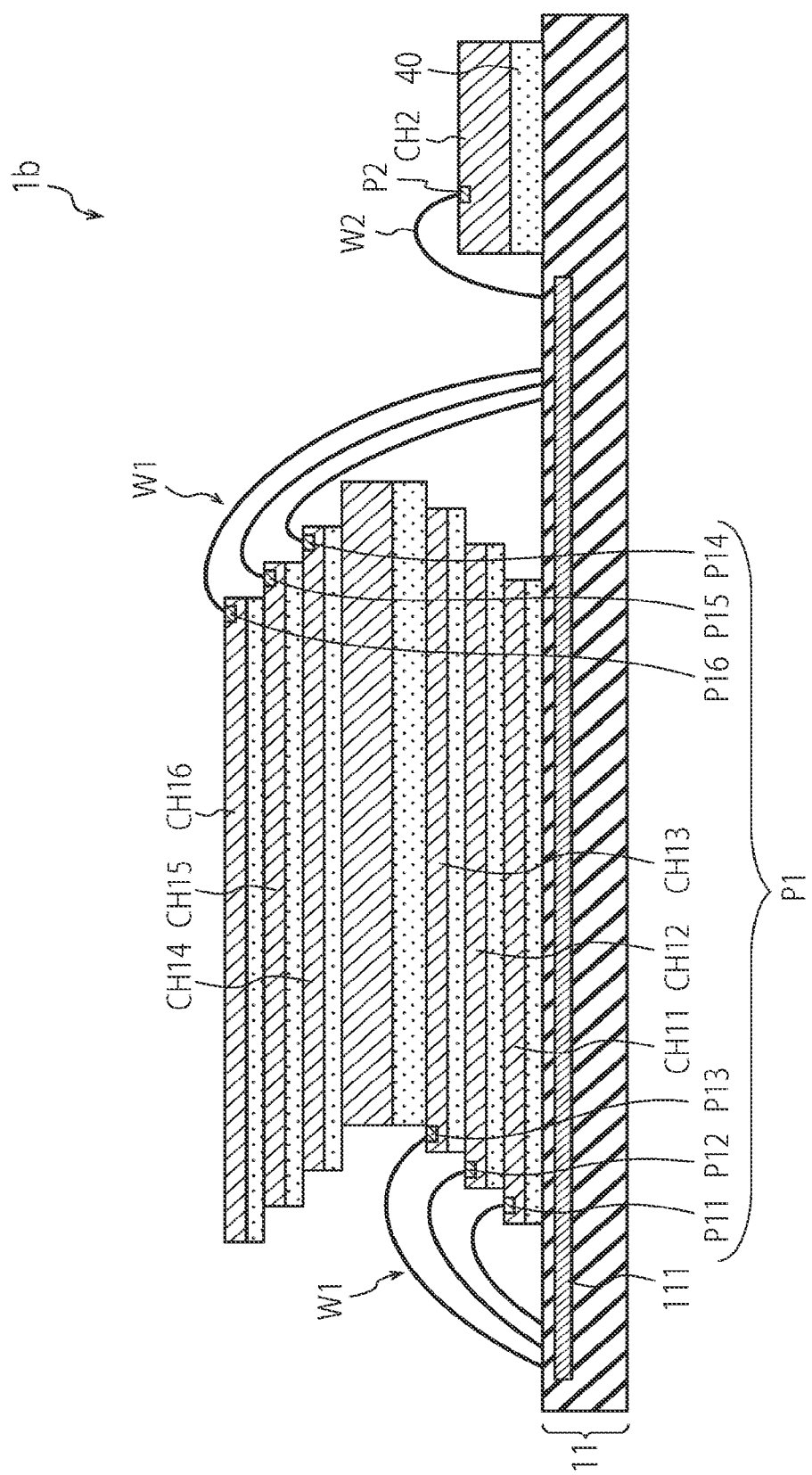
FIG. 7 is a cross sectional view of a semiconductor storage device according to a second comparative example and shows an exemplary configuration of the semiconductor storage device.

FIG. 7 is a cross sectional view of the semiconductor storage device 1b according to a second comparative example and shows an exemplary configuration of the semiconductor storage device 1b.

As a method for restraining the increase in the displacement amount O described in the first comparative example, there is known a method in which semiconductor chips CH14, CH15, CH16 are stacked so as to be displaced in the reverse direction of a displacement direction of the semiconductor chips CH11, CH12, CH13 from a middle of the stack as shown in FIG. 7. The semiconductor chips CH14, CH15, CH16 are included in the semiconductor chip group CH1. However, in this case, for example, the positions of pads P14, P15, P16 of the semiconductor chips CH14, CH15, CH16 need to be on the opposite side to the positions of the pads P11, P12, P13 of the semiconductor chips CH11, CH12, CH13. The pads P14, P15, P16 are included in the pad group P1. Accordingly, in the example shown in FIG. 7, the bonding of the wire group W1 is performed at right and left sides of the semiconductor chip group CH1. In this case, the wiring length between the semiconductor chips CH11, CH12, CH13 and the semiconductor chip CH2 is longer than the wiring length between the semiconductor chips CH14, CH15, CH16 and the semiconductor chip CH2. In the semiconductor chips CH11 to CH16 that are actually stacked, the thickness in the stacking direction is 100 μm or less, for example. The width of the semiconductor chips CH11 to CH16 is several millimeters, for example. That is, the wiring length is more greatly influenced by the length of the wiring 111 than by the length of the wire group W1 in the height direction. Accordingly, the variation in wiring length between the semiconductor chips CH11 to CH16 and the semiconductor chip CH2 becomes large for each of the semiconductor chips CH11 to CH16. As a result, there is a possibility that the variation in electric characteristic among the semiconductor chips CH11 to CH16 becomes large.

As the shape of the cutout surface CF, for example, a shape in which the cutout surface CF is bent in an L-shape is possible. That is, a rectangular cutout is formed at the corner portion where the surface F3 crosses the lateral surface FS. However, there is a possibility that the corner of the L-shape becomes a singular point for stress. For example, in some cases, the semiconductor chip CH12 is easily broken at a position corresponding to the corner of the L-shape.

The embodiments are examples, and the scope of the invention is not limited to them.

The invention claimed is:

1. A semiconductor storage device comprising a wiring substrate, a first semiconductor chip, a second semiconductor chip and a wire, wherein:
    the first semiconductor chip includes a first surface contacting with the wiring substrate, a second surface on an opposite side to the first surface, and a first pad provided on the second surface;
    the second semiconductor chip includes a third surface contacting with the second surface, a fourth surface on an opposite side to the third surface, and a cutout portion;
    the cutout portion is provided at a corner portion where the third surface crosses a lateral surface between the third surface and the fourth surface, and overlaps with at least a part of the first pad as viewed from above the fourth surface;

the wire electrically connects the first pad of the first semiconductor chip and the wiring substrate;

the wire is provided so as to be laterally away from a cutout surface of the second semiconductor chip;

the wire is provided so as to stand upward from the first pad and to extend downward such that a peak is formed; and the cutout surface is positioned above at least a portion of the wire from the first pad to the peak.

2. The semiconductor storage device according to claim 1, wherein the cutout portion is provided such that a cutout depth with respect to the third surface gradually increases from a center portion of the third surface to an outer periphery portion side.

3. The semiconductor storage device according to claim 1, wherein the cutout portion is provided such that an inclination angle of a cutout surface of the second semiconductor chip with respect to the third surface is constant.

4. The semiconductor storage device according to claim 1, wherein:

the second semiconductor chip further includes a semiconductor substrate disposed on the third surface, and a semiconductor element disposed on the fourth surface and provided on the semiconductor substrate; and the cutout portion is provided on the semiconductor substrate.

5. The semiconductor storage device according to claim 4, wherein the cutout portion is provided so as to be away from the semiconductor element.

6. The semiconductor storage device according to claim 1, wherein:

the second semiconductor chip includes a second pad on the fourth surface; and the second pad is disposed such that at least a part of the second pad overlaps with the cutout portion as viewed from above the fourth surface.

7. The semiconductor storage device according to claim 1, wherein:

the second semiconductor chip includes a second pad on the fourth surface; and the second pad is disposed such that at least a part of the second pad overlaps with the first pad as viewed from above the fourth surface.

8. The semiconductor storage device according to claim 1, wherein the second semiconductor chip is disposed such that a center position of the second semiconductor chip coincides with a center position of the first semiconductor chip as viewed from above the fourth surface.

9. The semiconductor storage device according to claim 1, wherein the first semiconductor chip contacts with the wiring substrate on the first surface, and does not include a cutout portion at a corner portion where the first surface crosses a lateral surface between the first surface and the second surface.

10. The semiconductor storage device according to claim 1, wherein the third surface of the second semiconductor chip is bonded to the second surface of the first semiconductor chip through an adhesion layer.

\* \* \* \* \*